(12) United States Patent
Hashimoto et al.

(10) Patent No.: US 12,300,504 B2
(45) Date of Patent: May 13, 2025

(54) FILM PROCESSING METHOD AND SEMICONDUCTOR DEVICE MANUFACTURING METHOD

(71) Applicant: Kioxia Corporation, Tokyo (JP)

(72) Inventors: Junichi Hashimoto, Yokkaichi Mie (JP); Mitsuhiro Omura, Nagoya Aichi (JP); Toshiyuki Sasaki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 799 days.

(21) Appl. No.: 17/005,568

(22) Filed: Aug. 28, 2020

(65) Prior Publication Data

US 2021/0296137 A1 Sep. 23, 2021

(30) Foreign Application Priority Data

Mar. 17, 2020 (JP) .................................. 2020-046615

(51) Int. Cl.
*H01L 21/00* (2006.01)
*H01L 21/033* (2006.01)
*H01L 21/311* (2006.01)

(52) U.S. Cl.
CPC .... *H01L 21/31144* (2013.01); *H01L 21/0332* (2013.01); *H01L 21/31116* (2013.01)

(58) Field of Classification Search
CPC ........... H01L 21/0332; H01L 21/31116; H01L 21/31144
See application file for complete search history.

(56) References Cited

U.S. PATENT DOCUMENTS

| 10,283,330 B2 | 5/2019 | Marakhtanov et al. |
| 10,460,950 B2 | 10/2019 | Kakimoto et al. |
| 10,734,402 B2 | 8/2020 | Yoshikawa |
| 11,043,394 B1* | 6/2021 | Hautala ............. C23C 16/45578 |
| 2005/0272265 A1* | 12/2005 | Geffken ............ H01L 21/31138 257/E21.252 |
| 2009/0081879 A1* | 3/2009 | Sukekawa ......... H01L 21/31116 438/735 |
| 2010/0022088 A1* | 1/2010 | Wallner ............ H01L 21/32139 438/712 |

(Continued)

FOREIGN PATENT DOCUMENTS

JP 2017-016791 A 1/2017
JP 6082639 B2 2/2017

(Continued)

OTHER PUBLICATIONS

"Planer, N., Sense 1-5." Oxford English Dictionary, Oxford UP, Jul. 2023, https://doi.org/10.1093/OED/1136531795. (Year: 2023).*

(Continued)

*Primary Examiner* — Reema Patel
(74) *Attorney, Agent, or Firm* — Foley & Lardner LLP

(57) ABSTRACT

A film processing method includes forming a target film, the target film having an upper surface. The method includes forming a carbon film on the upper surface of the target film. The method includes performing a first etching to format least one recess in the target film, with the carbon film serving as a mask. The method includes performing a second etching, by directing an ion beam through the at least one recess, to increase a depth of the at least one recess.

5 Claims, 21 Drawing Sheets

(56) References Cited

U.S. PATENT DOCUMENTS

| | | | |
|---|---|---|---|
| 2014/0061930 A1* | 3/2014 | Holmes | H01L 23/5226 |
| | | | 257/769 |
| 2016/0379902 A1 | 12/2016 | Hagio et al. | |
| 2017/0213753 A1 | 7/2017 | Rogers | |
| 2017/0213758 A1 | 7/2017 | Rice et al. | |
| 2019/0189423 A1 | 6/2019 | Ishino et al. | |

FOREIGN PATENT DOCUMENTS

| | | |
|---|---|---|
| JP | 2018-026331 A | 2/2018 |
| JP | 2019-050353 A | 3/2019 |

OTHER PUBLICATIONS

Hamaguchi et al., "Atomic Scale Assessment of Surface Reactions in Dry Etching Processing" J. Plasma Fusion Res., 2009, vol. 85, No. 4, pp. 177-184.

\* cited by examiner

| d(nm) | 100 | 100 | 100 | 100 | 100 |
|---|---|---|---|---|---|
| θ(°) | 2 | 3 | 5 | 10 | 20 |
| H(nm) | 2864 | 1908 | 1143 | 567 | 275 |

FILM PROCESSING METHOD AND SEMICONDUCTOR DEVICE MANUFACTURING METHOD

CROSS-REFERENCE TO RELATED APPLICATION(S)

This application is based upon and claims the benefit of priority from. Japanese Patent Application No. 2020-046615, filed Mar. 17, 2020, the entire contents of which are incorporated herein by reference.

FIELD

Embodiments described herein relate generally to a film processing method and a semiconductor device manufacturing method.

BACKGROUND

When a recess is formed in a target film on a wafer using an etching apparatus, a processing defect may be present in the recess partially due to the wear of components of the etching apparatus. Further, the processing defect may be present in any area of the processing target film.

DETAILED DESCRIPTION

Embodiments provide a film processing method and a semiconductor device manufacturing method which are capable of reducing a processing defect of a recess.

In general, according to one embodiment, a method includes forming a target film, the target film having an upper surface. The method includes forming a carbon film on the upper surface of the target film. The method includes performing a first etching to form at least one recess in the target film, with the carbon film serving as a mask. The method includes performing a second etching, by directing an ion beam through the at least one recess, to increase a depth of the at least one recess.

Hereinafter, embodiments of the present disclosure will be described with reference to the drawings. The embodiments do not limit the present disclosure.

First Embodiment

A film processing method according to a first embodiment will be described with reference to FIGS. 1 to 10.

Figure 1:
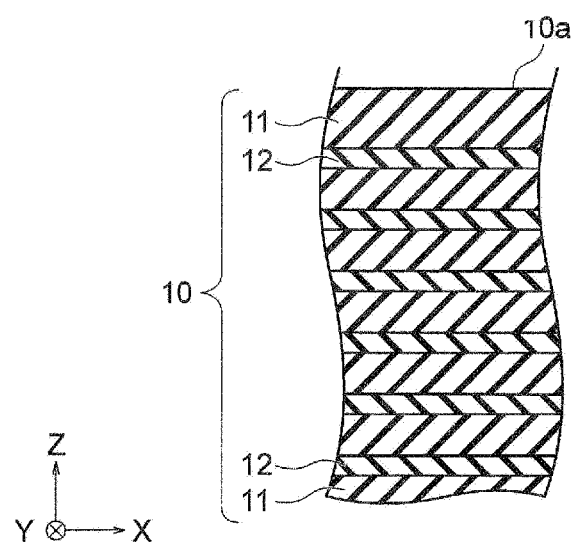
FIG. 1 is a cross-sectional view illustrating a process of forming a processing target film.

First, as illustrated in FIG. 1, a processing target film 10 is formed on a wafer (not illustrated). In the following description, the direction perpendicular to the upper surface 10a of the processing target film 10 is defined as a Z direction, and the two directions perpendicular to each other while being parallel with the upper surface 10a are defined as an X direction and a Y direction, respectively.

In the processing target film 10 illustrated in FIG. 1, insulating films 11 and 12 are alternately stacked in the Z direction. The insulating film 11 is an example of a first film, and contains silicon oxide ($SiO_2$). Meanwhile, the insulating film 12 is an example of a second film, and contains silicon nitride (SiN). The insulating films 11 and 12 may be formed by, for example, a CVD (chemical vapor deposition) or ALD (atomic layer deposition).

The processing target film 10 is not limited to the structure described above. The insulating film 12 may be a conductive film containing silicon or a metal film, and the processing target film 10 may be a single-layer film implemented by the insulating film 11.

Figure 2:
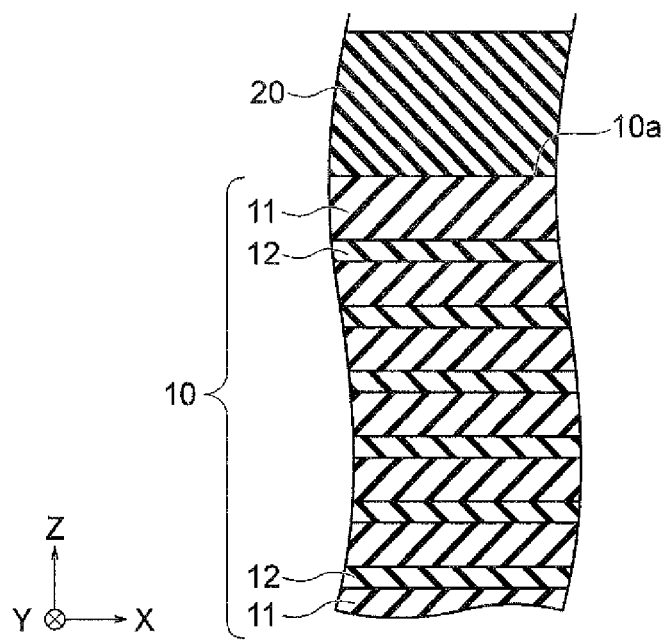
FIG. 2 is a cross-sectional view illustrating a process of forming a carbon film.

Next, as illustrated in FIG. 2, a carbon film 20 is formed on the upper surface 10a of the processing target film 10. The carbon film 20 may be formed by the CVD or ALD.

Figure 3:
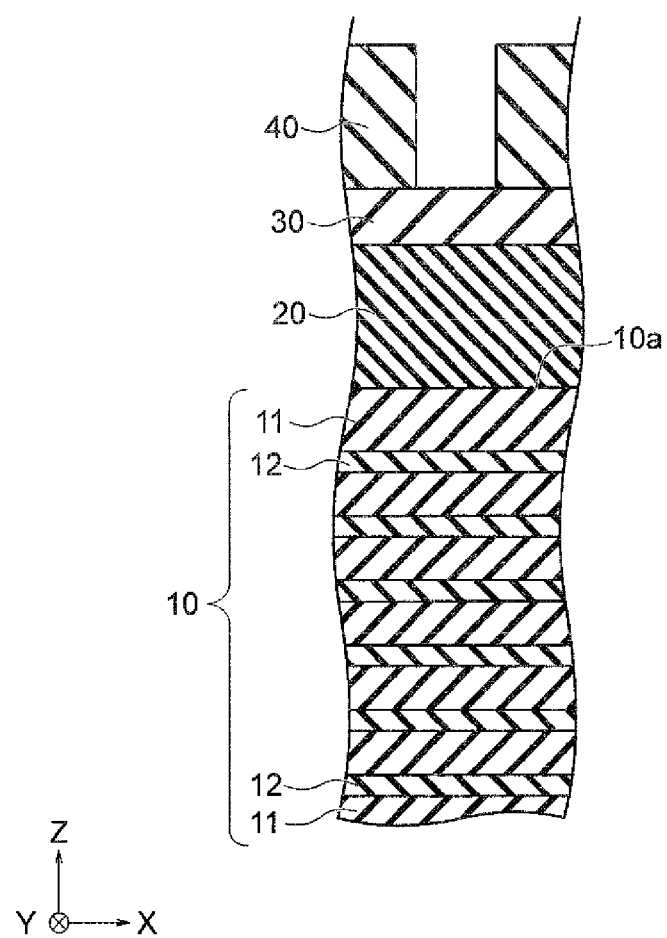
FIG. 3 is a cross-sectional view illustrating a process of forming an oxide film and a resist.

Next, as illustrated in FIG. 3, an oxide film 30 is formed on the carbon film 20. Subsequently, a resist 40 is applied onto the oxide film 30. An uneven pattern is formed in the resist 40 by lithography.

Figure 4:
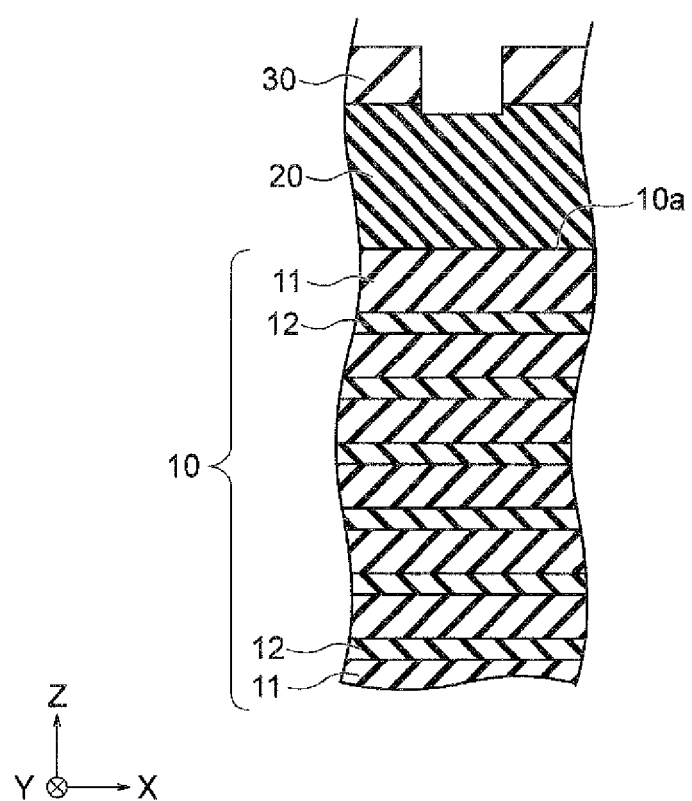
FIG. 4 is a cross-sectional view illustrating a process of removing the resist.

Next, as illustrated in FIG. 4, the uneven pattern of the resist 40 is transferred to the oxide film 30 by a dry etching. The resist 40 is removed by the dry etching.

Figure 5:
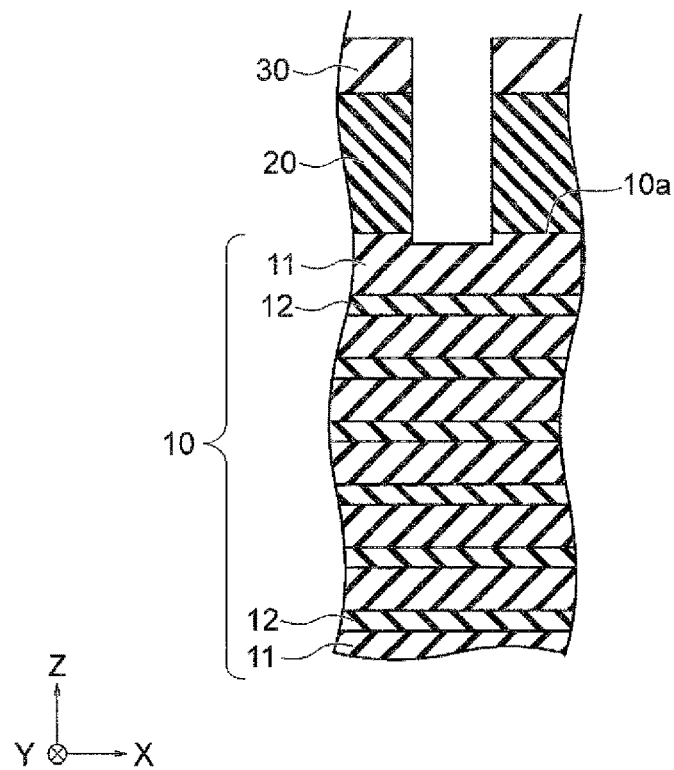
FIG. 5 is a cross-sectional view illustrating a process of etching the carbon film.

Next, as illustrated in FIG. 5, the carbon film 20 is etched using the oxide film 30 as a mask. As a result, the uneven pattern of the oxide film 30 is transferred to the carbon film 20.

Figure 6:
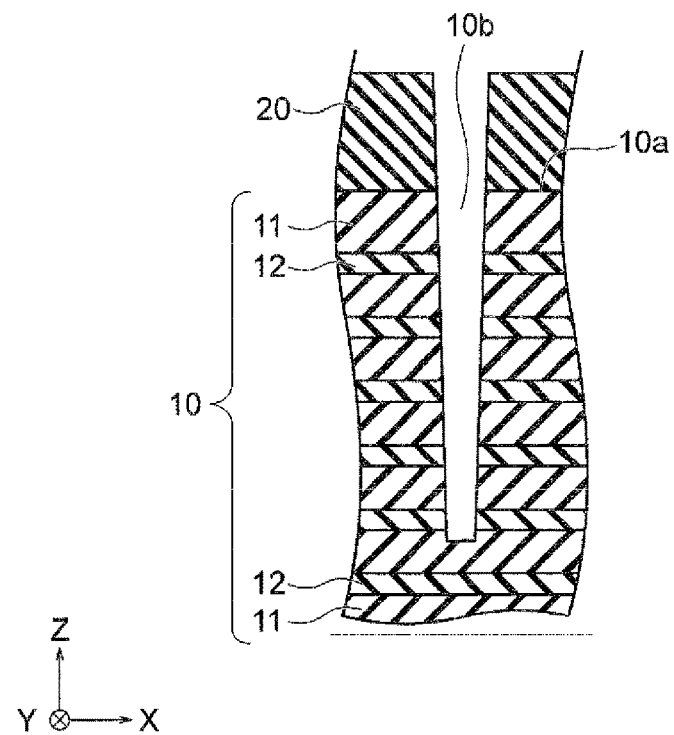
FIG. 6 is a cross-sectional view illustrating a process of forming a recess in the processing target film.

Next, as illustrated in FIG. 6, a first etching is performed to form a recess 10b in the processing target film 10, using the carbon film 20 as a mask. In the present embodiment, the first etching is performed in a plasma etching apparatus.

Figure 7:
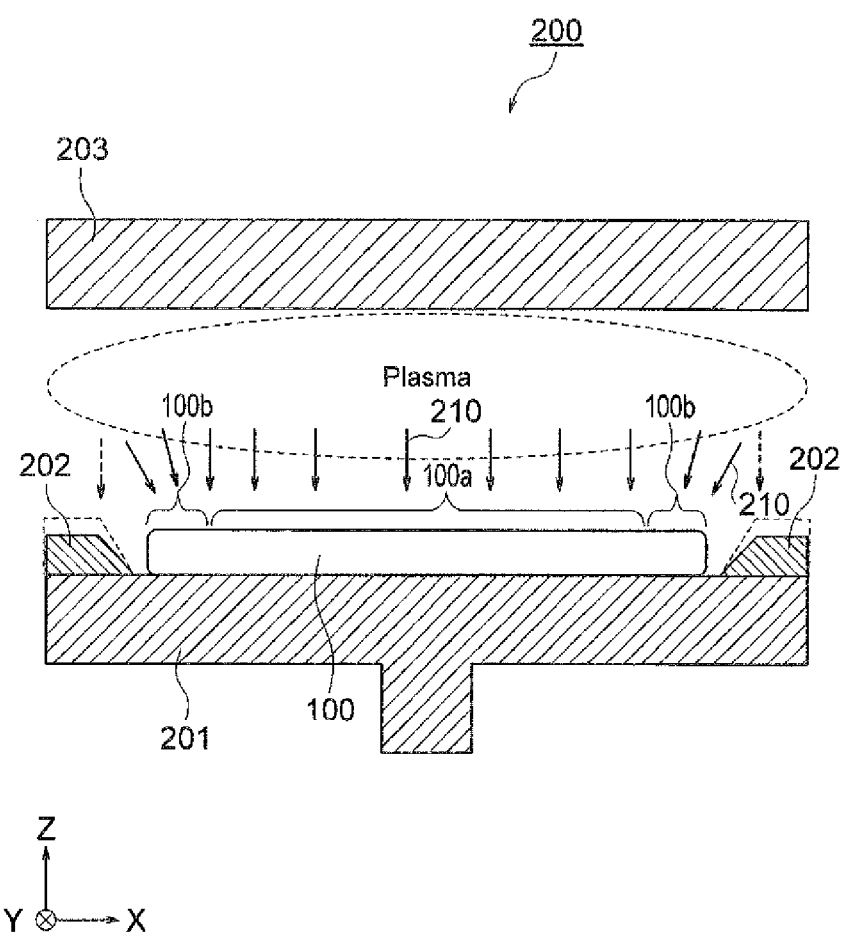
FIG. 7 is a schematic view of a plasma etching apparatus used for forming the recess.

FIG. 7 is a schematic view of the plasma etching apparatus used for forming the recess 10b. A plasma etching apparatus 200 illustrated in FIG. 7 includes a stage 201, an edge ring 202, and an electrode plate 203.

A wafer 100 is placed on the stage 201. The processing target film 10 described above is formed on the surface of the wafer 100. The edge ring 202 is an annular member provided on the outer peripheral portion of the stage 201 to surround the wafer 100. The electrode plate 203 faces the stage 201 and the edge ring 202. When a radio frequency power is supplied to the electrode plate 203, plasma is generated between the electrode plate 203 and the stage 201. At this time, a gas introduced into the plasma etching apparatus 200 is turned into plasma, and plasma ions 210 are generated. The plasma ions 210 are irradiated to the surface of the wafer 100.

In the plasma etching apparatus 200, the edge ring 202 is provided on the stage 201, which helps to uniformly generate the plasma between the center and the outer peripheral portion of the stage 201. However, when the edge ring 202 wears, the plasma ions 210 are irradiated obliquely with respect to the Z direction onto the outer peripheral area 100b of the wafer 100 while being irradiated in the Z direction onto the inner peripheral area 100a of the wafer 100.

Figure 8A:
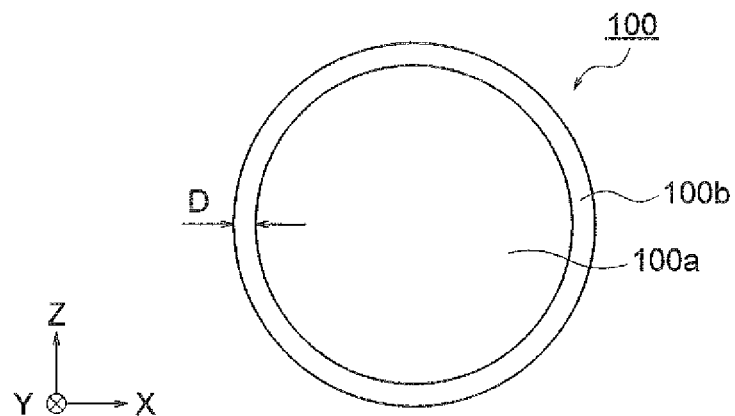
FIG. 8A is a plan view of a wafer.
Figure 8B:
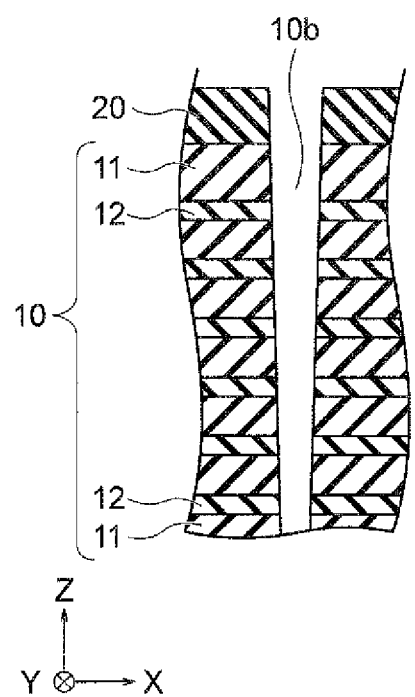
FIG. 8B is a cross-sectional view of the processing target film formed on an inner peripheral area of the wafer.
Figure 8C:
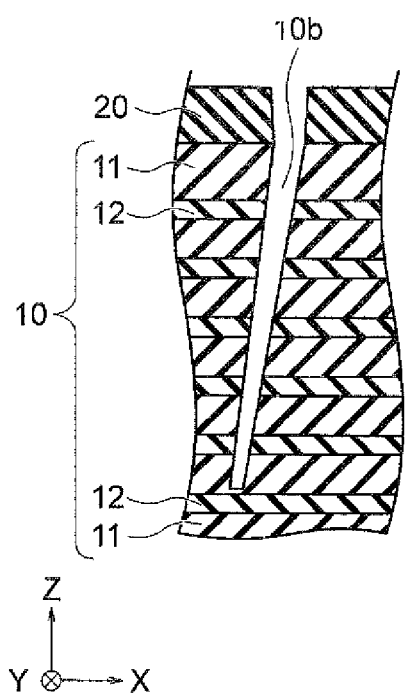
FIG. 8C is a cross-sectional view of the processing target film formed on an outer peripheral area of the wafer.

FIG. 8A is a plan view of the wafer 100. FIG. 8B is a cross-sectional view of the processing target film 10 formed in the inner peripheral area 100a of the wafer 100. FIG. 8C is a cross-sectional view of the processing target film 10 formed in the outer peripheral area 100b of the wafer 100. The inner peripheral area 100a of the wafer 100 includes the center of the wafer 100. Meanwhile, the outer peripheral area 100b is located outside the inner peripheral area 100a, and has a distance D of, for example, 10 mm from the outer peripheral end of the wafer 100.

As illustrated in FIG. 8B, even when the edge ring 202 wears, the plasma ions 210 are irradiated in the Z direction onto the inner peripheral area 100a of the wafer 100, and the recess 10b penetrates the processing target film 10 in the Z direction. Meanwhile, since the plasma ions 210 are irradiated obliquely onto the outer peripheral area 100b, the etching rate decreases, and the recess 10b is terminated in the middle of the processing target film 10.

Accordingly, in the present embodiment, a second etching is additionally performed only on the outer peripheral area 100b, using an ion beam irradiating apparatus configured to etch a local region. Hereinafter, the second etching will be described in detail.

Figure 9:
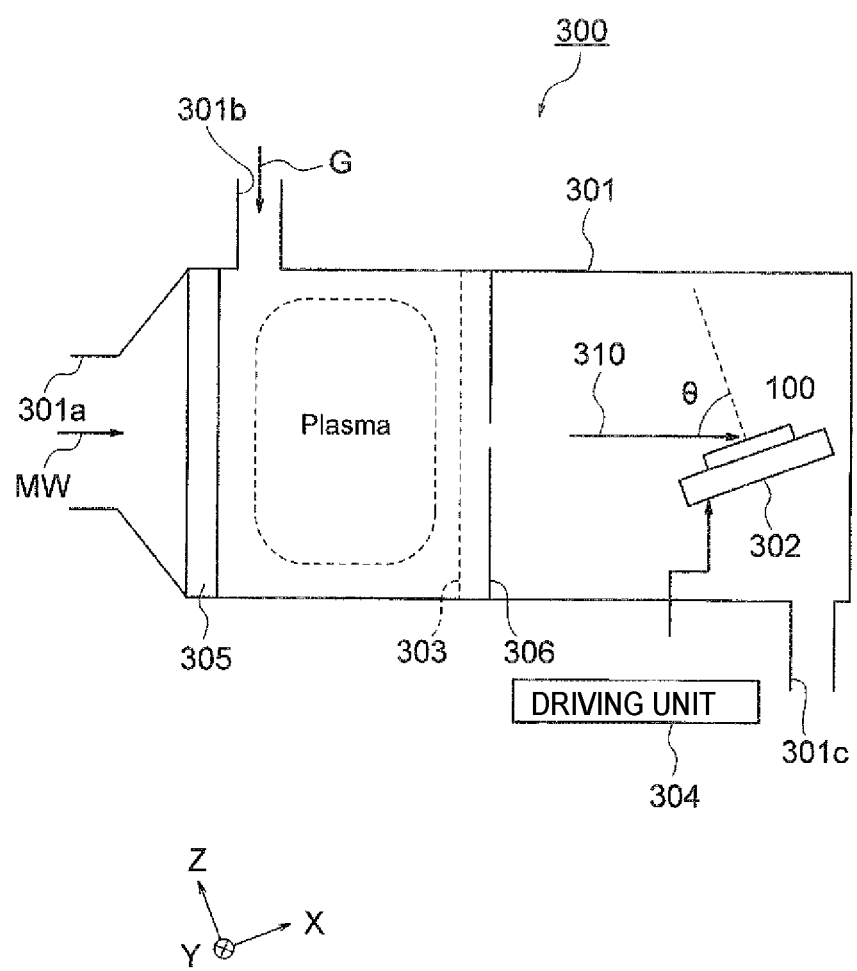
FIG. 9 is a schematic view of an ion beam irradiating apparatus.

FIG. 9 is a schematic view of the ion beam irradiating apparatus. An ion beam irradiating apparatus 300 illustrated in FIG. 9 is an ECR (electron cyclotron resonance) plasma type apparatus, and includes a vacuum chamber 301, a stage 302, an acceleration electrode 303, a driving unit 304, a quartz window 305, and an aperture 306. The vacuum chamber 301 includes a microwave inlet 301a, a gas inlet 301b, and an exhaust port 301c. When a magnetic field is generated in the vacuum chamber 301, and a microwave MW is introduced from the microwave inlet 301a through the quartz window 305, plasma is generated. In a state where the plasma is generated, when a gas G is introduced from the gas inlet 301b, and a predetermined acceleration voltage is applied to the acceleration electrode 303, an ion beam 310 passes through the opening of the aperture 306, and is irradiated to a specific area of the wafer 100 placed on the stage 302. While the ion beam irradiating apparatus 300 illustrated in FIG. 9 implements the local irradiation of the ion beam 310 through the aperture 306, the ion beam irradiating apparatus 300 may include a condenser lens, while remaining within the scope of the present disclosure. In such a case, the ion beam 310 may be locally irradiated (or directed) toward the wafer 100.

In the ion beam irradiating apparatus 300, the irradiation angle θ of the ion beam 310 toward the wafer 100 may be controlled in the manner that the driving unit 304 drives the stage 302. The irradiation angle θ is set based on an RF cumulative time obtained by adding up the time for generating the radio frequency in the plasma etching apparatus 200 illustrated in FIG. 7. The RF cumulative time corresponds to the plasma generation cumulative time. The plasma generation cumulative time is related to the worn state of the edge ring 202. Further, the worn state of the edge ring 202 is related to an inclination angle of the recess 10b formed in the outer peripheral area 100b of the wafer 100 with respect to the Z direction as illustrated in FIG. 8C.

The driving unit 304 drives the stage 302 according to the RF cumulative time. As a result, the ion beam 310 is irradiated to the outer peripheral area 100b of the wafer 100 at the irradiation angle θ preset according to the RF cumulative time. Further, the time for irradiating the ion beam 310 is preset according to the irradiation angle θ.

In the ion beam irradiating apparatus 300, the beam spot (half width) of the ion beam 310 may be narrowed down to about 3 mm at the minimum. Thus, the ion beam 310 may be irradiated to only the outer peripheral area 100b having the distance D of about 10 mm from the outer peripheral end of the wafer 100, and may not be irradiated to the inner peripheral area 100a.

Figure 10:
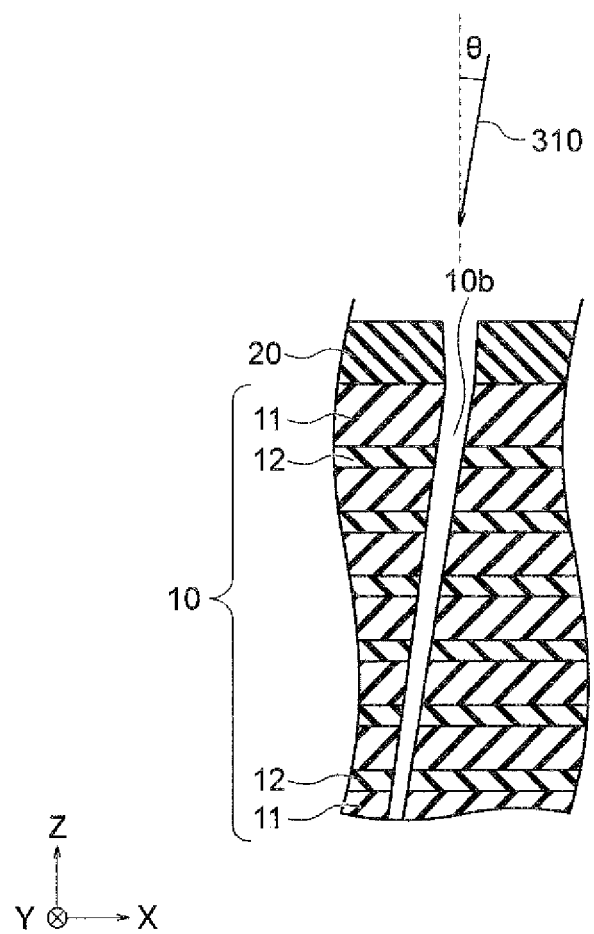
FIG. 10 is a cross-sectional view illustrating a state of the processing target film after an irradiation with an ion beam.

FIG. 10 is a cross-sectional view illustrating a state of the processing target film 10 after the irradiation of the ion beam 310. Since the ion beam 310 is irradiated at the optimum irradiation angle θ with respect to the inclination angle of the recess 10b formed in the processing target film 10 of the outer peripheral area 100b, the depth of the recess 10b increases, so that the recess 10b penetrates the processing target film 10.

Thus, according to the present embodiment, the processing defect caused from the wear of the edge ring 202 can be reduced.

Second Embodiment

Hereinafter, a film processing method according to a second embodiment will be described. In this embodiment, since the process until the recess 10b is formed in the processing target film 10 using the plasma etching apparatus 200 is the same as that in the first embodiment, descriptions thereof will be omitted.

In the present embodiment, after the recess 10b is formed, a process of measuring the shape of the recess 10b is performed.

Figure 11:
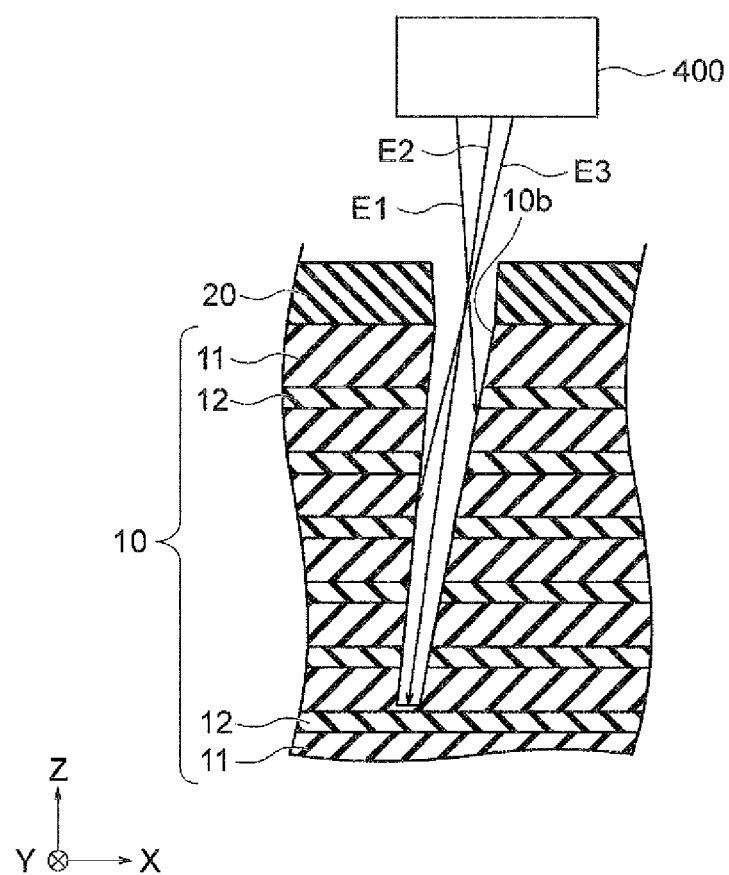
FIG. 11 is a schematic view illustrating a process of measuring a shape of a recess.

FIG. 11 is a schematic view illustrating the process of measuring the shape of the recess 10b. In this process, first, a measuring apparatus 400 irradiates electron beams E1 to E3 having different incident angles into the recess 10b at different timings.

Each of the electron beams E1 to E3 is reflected on the inner surface of the recess 10b, and the measuring apparatus 400 measures the reflected electrons. The measuring apparatus 400 measures a response time from the irradiation of the electron beams E1 to E3 to the detection of the reflected electrons.

Figure 12A:
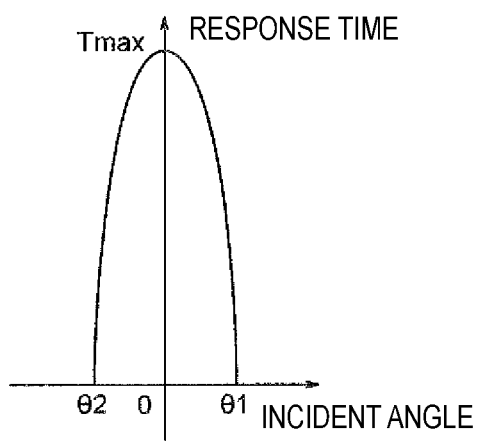
FIG. 12A is a graph illustrating a relationship between an incident angle and a response time when a recess is not inclined.
Figure 12B:
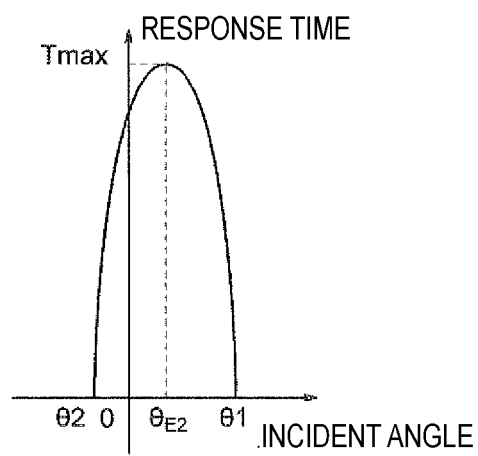
FIG. 12B is a graph illustrating the relationship between the incident angle and the response time when the recess is inclined.

FIGS. 12A and 12B are views illustrating a relationship between the incident angles of the electron beams and the response time. FIG. 12A represents the relationship between the incident angles and the response time when the recess 10b is not inclined. FIG. 12B represents the relationship between the incident angles and the response time when the recess 10b is inclined. In the graphs represented in FIGS. 12A and 12B, the horizontal axis represents the incident angle, and the vertical axis represents the response time.

The response time has the maximum value at the incident angle that corresponds to substantially the center of the variation range of the incident angle. For example, when the variation range of the incident angle is $\theta1$ to $\theta2$, the longest response time Tmax is obtained at the incident angle of $(\theta1-\theta2)/2$. At an incident angle larger than $(\theta1-\theta2)/2$, the response time is reduced as the incident angle is inclined in the positive direction. Further, at an incident angle smaller than $(\theta1-\theta2)/2$, the response time is reduced as the incident angle is inclined in the negative direction.

For example, when the recess 10b is not inclined with respect to the Z direction, the response time of the electron beam incident at the incident angle set to 0° is the longest as illustrated in FIG. 12A. In other words, when the recess 10b extends along the Z direction, the response time of the electron beam incident in the Z direction is the longest.

Meanwhile, when the recess 10b is inclined with respect to the Z direction as illustrated in FIG. 11, the response time of the electron beam incident at an incident angle set to a predetermined value (other than 0°) is the longest as illustrated in FIG. 12B. In other words, when the recess 10b extends obliquely with respect to the Z direction, the response time of the electron beam incident obliquely with a predetermined angle from the Z direction is the longest. FIG. 12B represents a case where the longest response time Tmax is measured at the incident angle $\theta_{E2}$ of the electron beam E2.

The measuring apparatus 400 determines whether the recess 10b is inclined, based on the incident angle that corresponds to the longest response time Tmax. Then, the wafer 100 is conveyed to the ion beam irradiating apparatus 300 illustrated in FIG. 9. At this time, the determination result of the measuring apparatus 400 is also transmitted to the ion beam irradiating apparatus 300 illustrated in FIG. 9.

In the ion beam irradiating apparatus 300, the ion beam 310 is irradiated toward the processing target film 10 formed on the wafer 100. At this time, the area irradiated with the ion beam 310 is the area where the recess 10b determined to be inclined by the measuring apparatus 400 is formed. Further, the irradiation angle of the ion beam 310 is set based on the incident angle of the electron beam that corresponds to the longest response time Tmax.

According to the present embodiment described above, the measuring apparatus 400 specifies the area where the inclined recess 10b is formed, and the ion beam irradiating apparatus 300 irradiates the ion beam 310 only to the specified area. As a result, the processing defect of the recess 10b may be reliably reduced.

Third Embodiment

In this embodiment, descriptions will be made on an example where the film processing method described in the first and second embodiments is applied to a semiconductor device having a memory cell array with a three-dimensional structure. The semiconductor device is a NAND type non-volatile semiconductor storage device in which data may be erased and written electrically freely, and stored contents may be kept even when the power is turned off.

Figure 13:
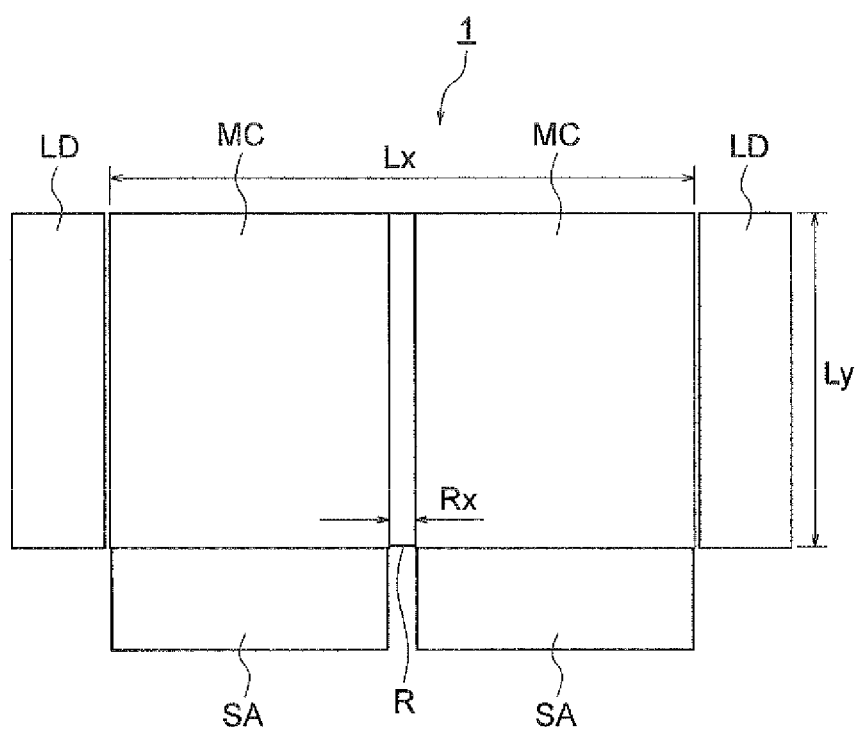
FIG. 13 is a schematic plan view of a semiconductor device according to a third embodiment.

FIG. 13 is a schematic plan view of the semiconductor device according to the present embodiment. As illustrated in FIG. 13, a semiconductor device 1 according to the present embodiment includes a memory cell area MC, a peripheral circuit area LD, and a sense amplifier circuit area SA.

Memory cells are formed in the memory cell area MC. In the present embodiment, two memory cell areas MC are arranged in the X direction. The two memory cell areas MC are separated from each other by an insulating area R. The length Rx of the insulating area R in the X direction is, for example, about 0.5 mm. Further, the length Lx obtained by adding the lengths of the two memory cell areas MC in the X direction to the length Rx is, for example, about 12 mm. Further, the length Ly of each memory cell area MC in the Y direction is, for example, about 5 mm.

The peripheral circuit area LD is adjacent to the end of each memory cell area MC in the X direction. A row decoder circuit or the like for selecting a memory cell is provided in the peripheral circuit area LD.

The sense amplifier circuit area SA is adjacent to the end of each memory cell area MC in the Y direction. In the sense amplifier circuit area SA, a sense amplifier circuit amplifies a signal output from a memory cell.

Figure 14:
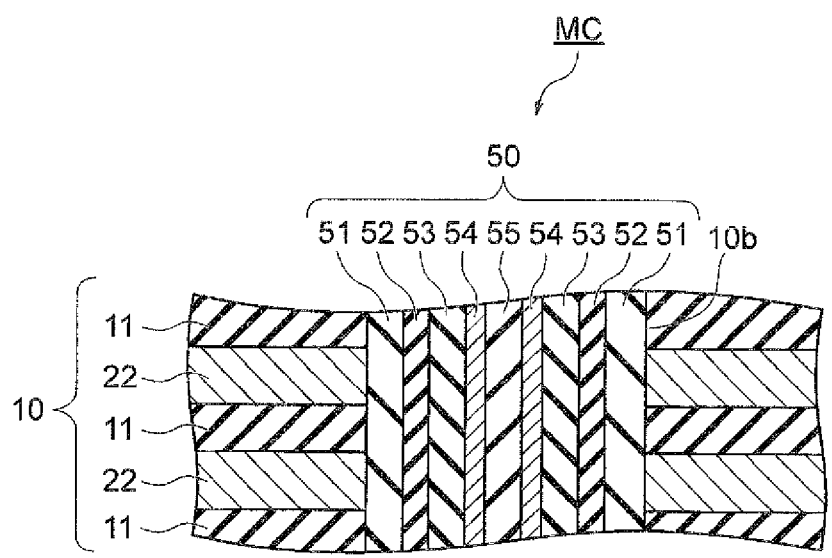
FIG. 14 is a cross-sectional view illustrating a portion of a structure of a memory cell area.

FIG. 14 is a cross-sectional view illustrating a portion of a structure of the memory cell area MC. As illustrated in FIG. 14, an insulating film 11 and an electrode film 22 are alternately formed in the Z direction in the memory cell area MC. The electrode film 22 functions as a word line, and is provided at the portion from which the insulating film 12 is removed as described in the first embodiment.

Further, in the memory cell area MC, a semiconductor film 50 is provided in the recess 10b. A memory cell is formed at the intersection of the semiconductor film 50 and the electrode film 22. In the semiconductor film 50, a block insulating film 51, a charge storage film 52, a tunnel insulating film 53, a channel film 54, and a core film 55 are stacked in this order. The block insulating film 51, the charge storage film 52, and the tunnel insulating film 53 are an example of a memory film.

The block insulating film 51, the tunnel insulating film 53, and the core film 55 contain, for example, silicon oxide. The charge storage film 52 contains, for example, silicon nitride. Meanwhile, a high dielectric constant insulating film (High-k) may be used as the material for the block insulating film 51, the charge storage film 52, and the tunnel insulating film 53. The channel film 54 contains polysilicon.

Hereinafter, a method of manufacturing the memory cell area MC will be described. The process until the recess 10b is formed in the processing target film 10 by using the plasma etching apparatus 200 is the same as that in the first embodiment, and therefore descriptions thereof will be omitted.

Figure 15:
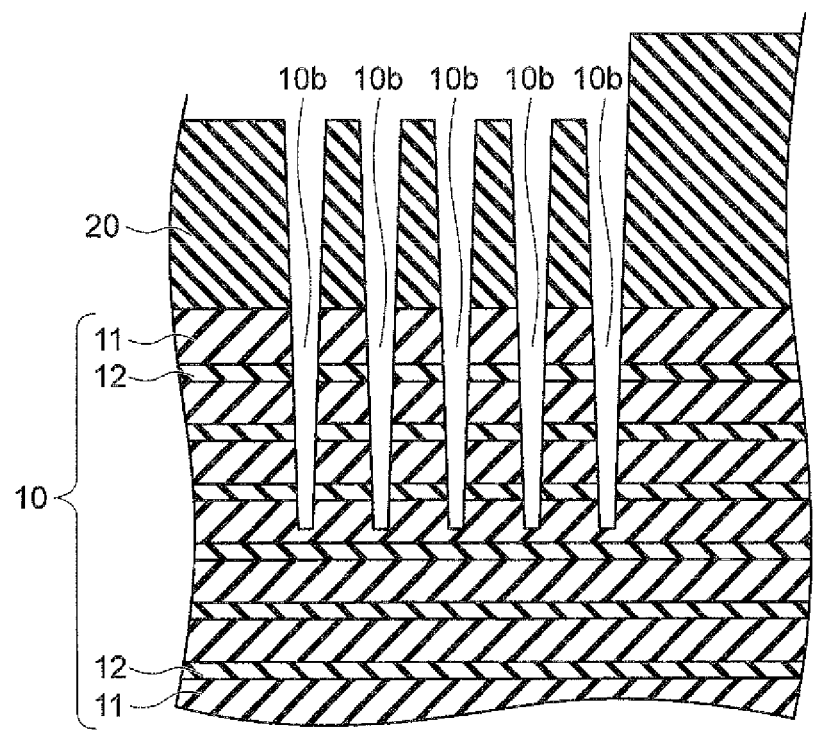
FIG. 15 is a cross-sectional view of the end portion of the memory cell area immediately after a recess is formed.

FIG. 15 is a cross-sectional view of the end portion of the memory cell area MC immediately after the recess 10b is formed. The end portion of the memory cell area MC corresponds to, for example, the boundary between the memory cell area MC and the peripheral circuit area LD or the boundary between the memory cell area MC and the sense amplifier circuit area SA. When the recess 10b is formed, a stepped difference may be formed in the carbon film 20 of the end portion of the memory cell area MC due to a difference in remaining film, as illustrated in FIG. 15. In this case, the processing defect in which the recess 10b is terminated in the middle of the processing target film 10 may easily occur.

Figure 16:
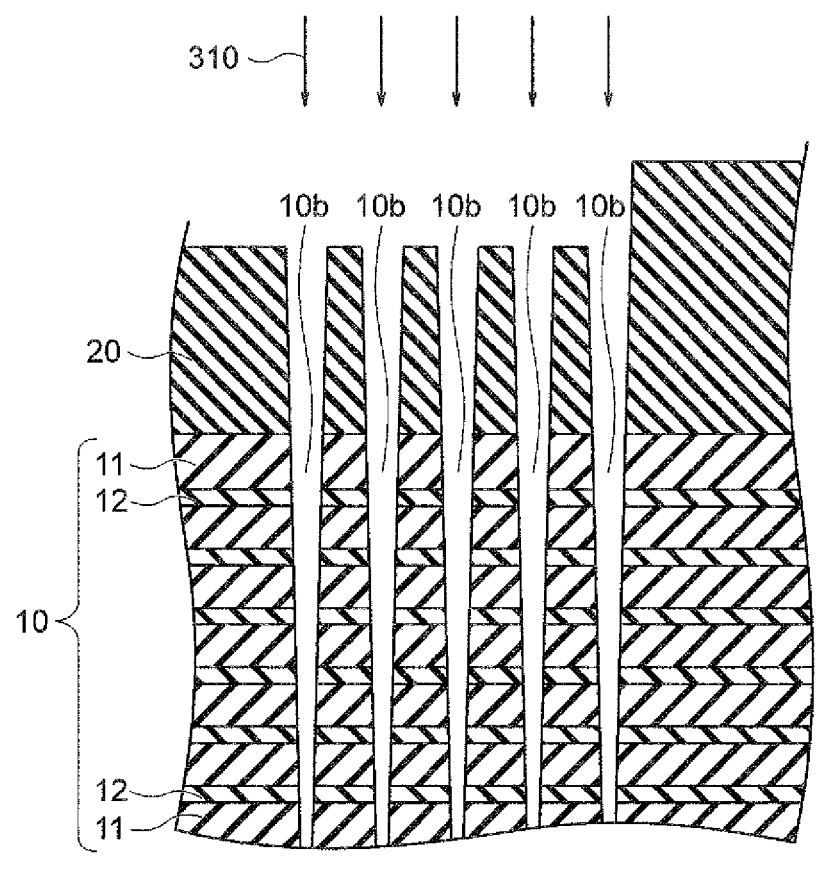
FIG. 16 is a cross-sectional view illustrating an etching for irradiating only the end portion of the memory cell area with an ion beam.

Accordingly, in the present embodiment, an etching is additionally performed to irradiate only the end portion of the memory cell area MC with the ion beam 310, as illustrated in FIG. 16. As a result, the depth of the recess 10b may be increased such that the recess 10b formed at the end portion of the memory cell area MC penetrates the processing target film 10.

The irradiation of the ion beam 310 is performed using the ion beam irradiating apparatus 300 illustrated in FIG. 9. However, in the present embodiment, since the recess 10b is not inclined with respect to the Z direction, the ion beam 310 is irradiated toward the recess 10b along the Z direction, that is, by setting the irradiation angle to 0°.

When the irradiation of the ion beam 310 is ended, the semiconductor film 50 described above is formed in the recess 10b by, for example, the CVD or ALD. Subsequently, the insulating film 12 is removed with, for example, a phosphoric acid solution, and the electrode film 22 is formed at the portion from which the insulating film 12 is removed. As a result, the memory cell area MC is completed.

According to the present embodiment described above, it is possible to reduce the processing defect of the recess 10b that may occur at the end portion of the memory cell area MC.

Fourth Embodiment

Hereinafter, a fourth embodiment will be described. In the first to third embodiments described above, the carbon film 20 is also used as a mask when the second etching by the irradiation of the ion beam 310 is performed, as in the first etching by the irradiation of the plasma ions 210. In this case, a fluorine carbide (CF)-based film may be deposited on the carbon film 20 during the first etching, and foreign matters may be generated due to the CF-based film.

Figure 17:
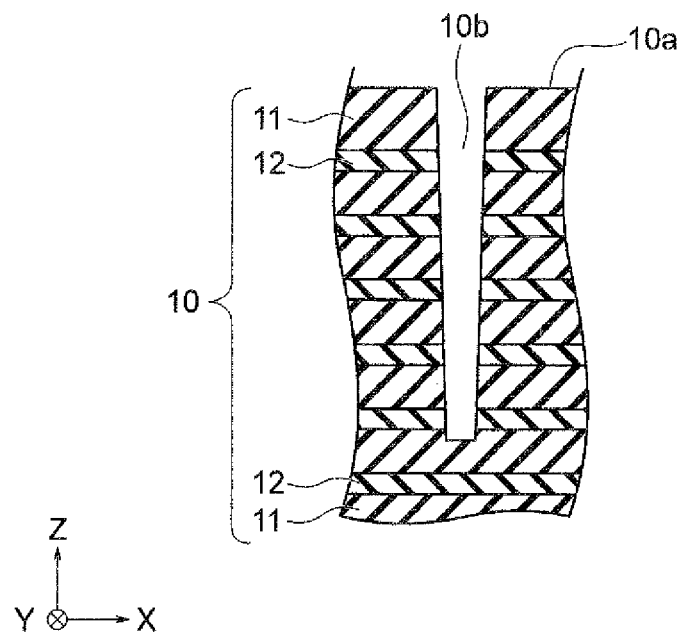
FIG. 17 is a cross-sectional view illustrating a process of peeling the carbon film from the processing target film.

Accordingly, in the present embodiment, after forming the recess 10b in the processing target film 10, the carbon film 20 is peeled from the processing target film 10 by performing an asking using oxygen. This is illustrated in FIG. 17.

Figure 18:
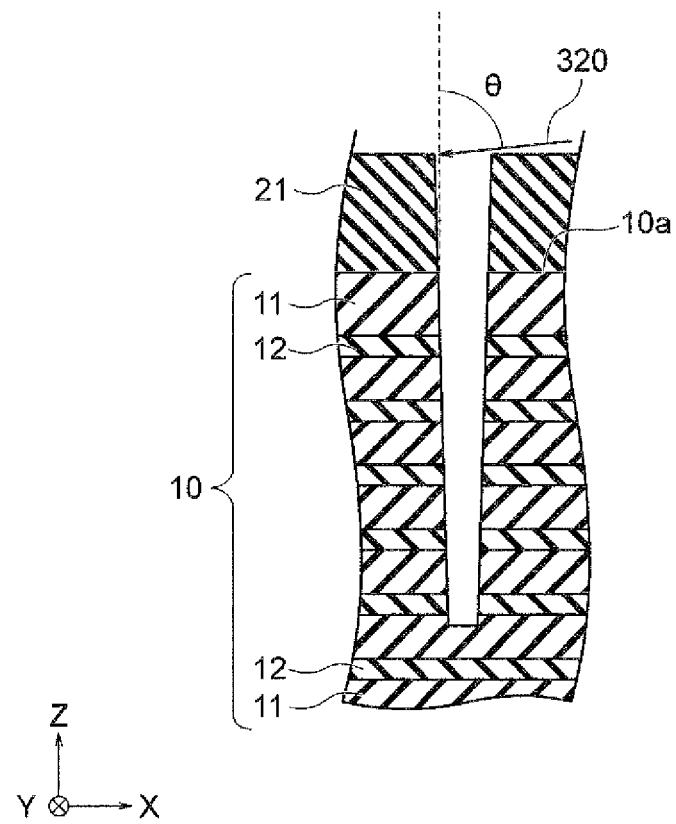
FIG. 18 is a cross-sectional view illustrating a process of forming a carbon film by an irradiation with an ion beam.

Next, as illustrated in FIG. 18, a carbon film 21 is formed by irradiating the upper surface 10a of the processing target film 10 with an ion beam 320. The carbon film 21 may be formed using the ion beam irradiating apparatus 300 illustrated in FIG. 9.

In the ion beam irradiating apparatus 300, when the gas G containing carbon is introduced into the vacuum chamber 301 from the gas inlet 301b, and an acceleration voltage lower than the acceleration voltage of the ion beam 310, for example, a voltage of 50 eV or less is applied to the acceleration electrode 303, the ion beam 320 is irradiated. As a result, as illustrated in FIG. 18, the carbon film 21 may be formed on the upper surface 10a of the processing target film 10.

Figure 19:
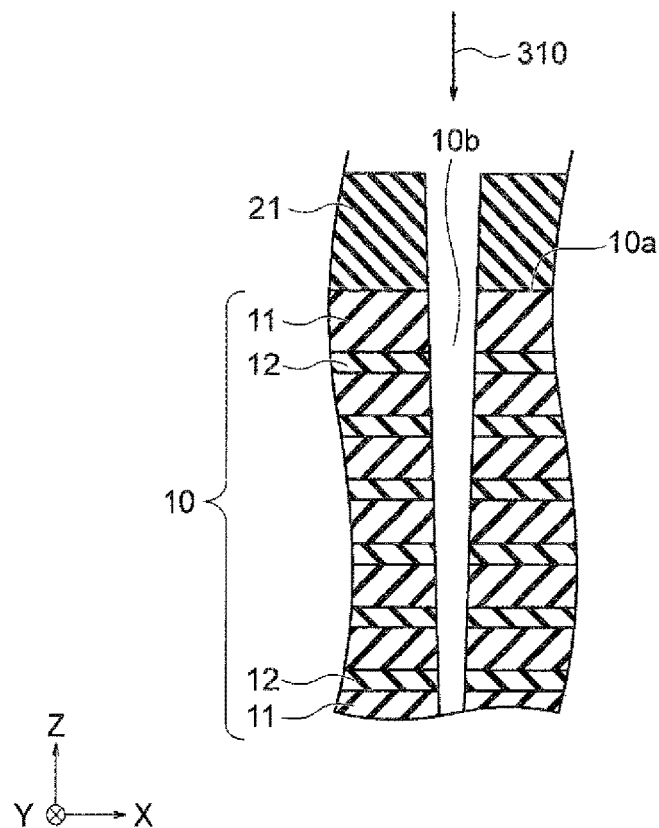
FIG. 19 is a cross-sectional view illustrating an etching by an irradiation with an ion beam.

Subsequently, in the ion beam irradiating apparatus 300, the ion beam 310 is irradiated to only the specific area, that is, the outer peripheral region 100b of the wafer 100 or the end portion of the memory cell area MC. At this time, the carbon film 21 functions as a mask. As a result, the recess 10b penetrates the processing target film 10. Meanwhile, the irradiation angle of the ion beam 310 is appropriately set according to the shape of the recess 10b. For example, as illustrated in FIG. 19, when the recess 10b is not inclined with respect to the Z direction, the ion beam 310 is irradiated along the Z direction, that is, by setting the irradiation angle to 0°. Thereafter, the carbon film 21 is peeled from the processing target film 10 by an asking using oxygen. Meanwhile, when the recess 10b is inclined with respect to the Z direction, the ion beam 310 is irradiated along the inclination direction.

According to the present embodiment, the generation of foreign matters is prevented by removing the carbon film 20 after forming the recess 10b. As a result, the manufacturing yield may be improved.

Meanwhile, the ions contained in the ion beam 310 may be a simple substance of an atom or a cluster ion in which multiple atoms are combined with each other. The cluster ion may be generated by, for example, ionizing a cluster obtained by adiabatically expanding a gas and accelerating the ionized cluster with an acceleration electrode.

Fifth Embodiment

Hereinafter, a film processing method according to a fifth embodiment will be described. In this embodiment, since the process until the carbon film 20 is etched using the oxide film 30 as a mask is the same as that in the first embodiment, descriptions thereof will be omitted.

Figure 20:
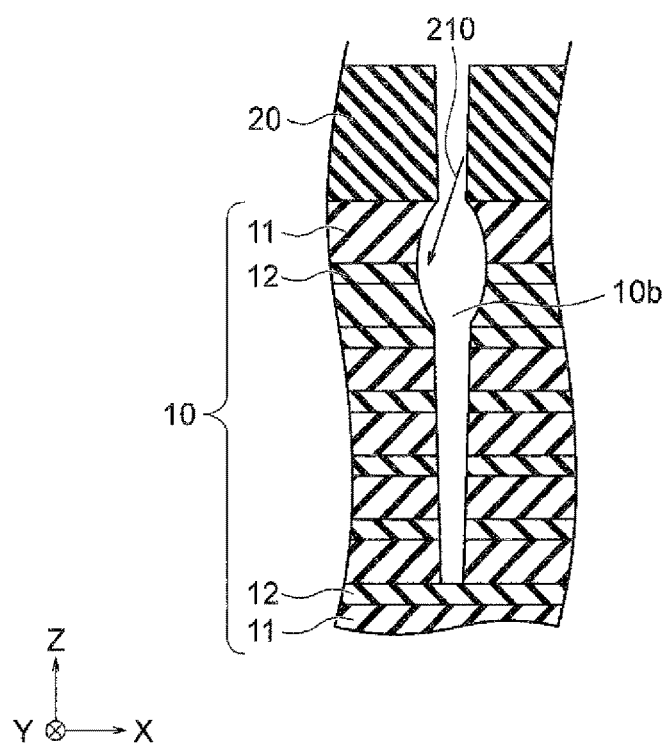
FIG. 20 is a cross-sectional view illustrating a processing defect in which an opening diameter of an upper portion of a recess is expanded.

When the etching of the carbon film 20 is ended, the formation of the recess 10b on the processing target film 10 is started using the carbon film 20 as a mask, in the plasma etching apparatus 200 illustrated in FIG. 7. At this time, as illustrated in FIG. 20, the plasma ions 210 generated in the plasma etching apparatus 200 may be reflected on the inner surface of the carbon film 20, and may be incident on the recess 10b. In this case, the processing defect in which the opening diameter of the upper portion of the recess 10b is expanded (bowing) may occur.

Accordingly, in the present embodiment, the wafer 100 is removed from the plasma etching apparatus 200 during the formation of the recess 10b, and mounted in the ion beam irradiating apparatus 300.

Figures 21, 22:
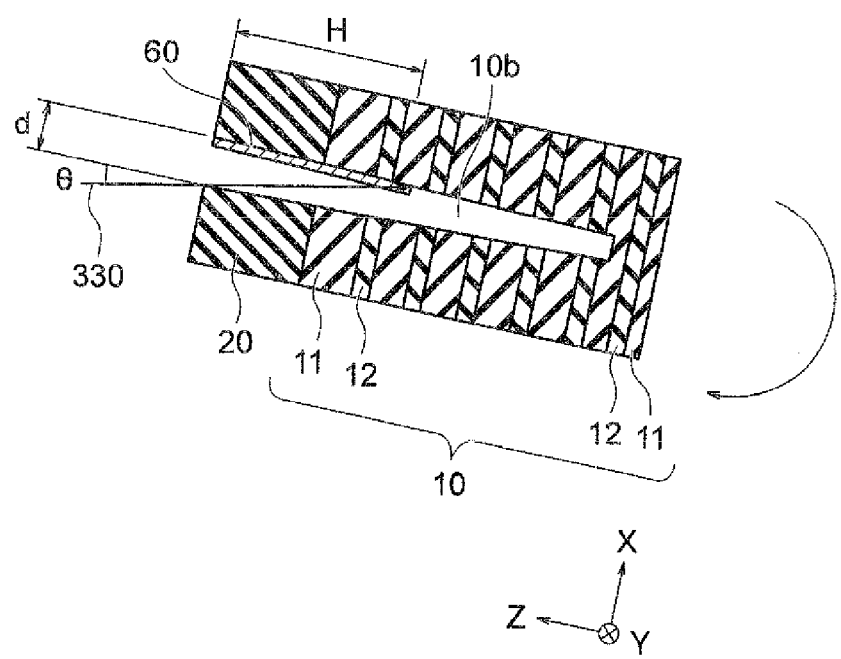
FIG. 21 is a cross-sectional view illustrating a process of forming a protective film.
FIG. 22 is a table illustrating an example of conditions for forming the protective film.

Next, as illustrated in FIG. 21, a protective film 60 is formed on the inner surface of the recess 10b by an irradiation of an ion beam 330. When the protective film 60 is formed, a CHF-based gas containing a carbon element, a hydrogen element, and a fluorine element, or a CF-based gas containing a carbon element and a fluorine element is introduced into the vacuum chamber 301 from the gas inlet 301b. Further, an acceleration voltage lower than the acceleration voltage of the ion beam 310, for example, a voltage of 50 eV or less is applied to the acceleration electrode 303. As a result, the ion beam 330 may be generated.

FIG. 22 is a table illustrating an example of conditions for forming the protective film 60. As represented in FIG. 22, the deposition depth H of the protective film 60 from the carbon film 20 relies on the opening diameter "d" of the recess 10b and the irradiation angle θ of the ion beam 330 to the recess 10b. For example, when the opening diameter "d" is 100 nm, and the irradiation angle θ is 5°, the protective film 60 may be formed to a depth of about 1,143 nm from the carbon film 20.

Further, when the driving unit 304 rotates the stage 302 by 360° about the Y direction as an axis, the protective film 60 may be formed over the entire circumference of the inner surface of the recess 10b. Further, when the ion beam 330 is irradiated after the driving unit 304 rotates the stage 302 by 180°, the protective films 60 may be formed in a pattern of two lines that face each other.

After the protective film 60 is formed, the wafer 100 is taken out from the ion beam irradiating apparatus 300, and mounted again in the plasma etching apparatus 200. Subsequently, the first etching for forming the recess 10b is performed. Thereafter, similarly to the first to fourth embodiments, the second etching is performed by the irradiation of the ion beam 310 in the ion beam irradiating apparatus 300.

According to the present embodiment described above, the protective film 60 is formed, so that it is possible to reduce the processing defect in which the opening diameter of the upper portion of the recess 10b is expanded.

Sixth Embodiment

Hereinafter, a film processing method according to a sixth embodiment will be described. In this embodiment, the method of forming the protective film is different from that in the fifth embodiment. The method of forming the protective film according to the present embodiment will be described with reference to FIGS. 23 and 24.

Figure 23:
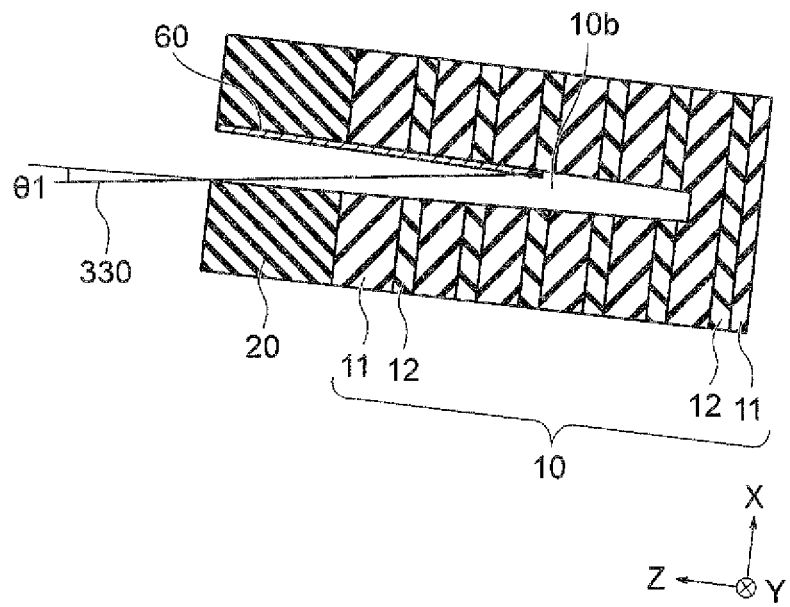
FIG. 23 is a cross-sectional view illustrating a process of forming a protective film by irradiating an ion beam at a first irradiation angle.

First, as illustrated in FIG. 23, the ion beam 330 is irradiated into the recess 10b at a first irradiation angle θ1 set to, for example, 3°. As a result, the protective film 60 is formed in the recess 10b.

Figure 24:
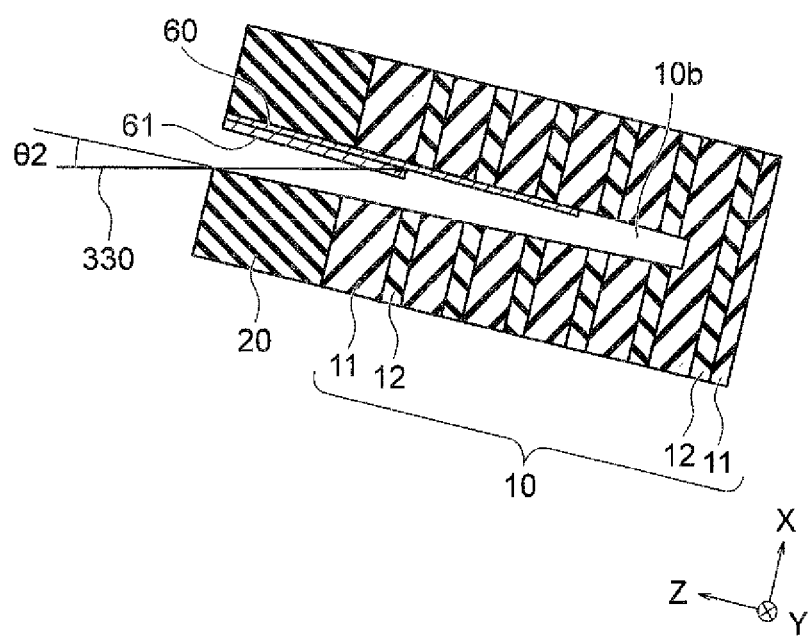
FIG. 24 is a cross-sectional view illustrating a process of forming a protective film by irradiating an ion beam at a second irradiation angle.

Next, as illustrated in FIG. 24, the ion beam 330 is irradiated into the recess 10b at a second irradiation angle θ2 set to, for example, 5°. As a result, a protective film 61 is formed on the protective film 60. The second irradiation angle θ2 is larger than the first irradiation angle θ1. Thus, as illustrated in FIG. 22, the deposition depth of the protective film 61 is shorter than the deposition depth of the protective film 60. As a result, as illustrated in FIG. 24, the protective film 61 is deposited on a portion of the protective film 60. The portion where the protective film 61 is deposited is a portion of the recess 10b where the opening diameter may be easily expanded.

Thus, according to the present embodiment, a relatively thick protective film is formed on the portion where the opening diameter may be easily expanded, so that it is possible to further reduce the occurrence of the processing defect.

Meanwhile, in the present embodiment, the number of times of changing the irradiation angle of the ion beam 330 is one. However, the number of the changing times may be two or more. As the number of times of changing the irradiation angle increases, it becomes possible to finely control the shape of the recess 10b.

Seventh Embodiment

Hereinafter, a film processing method according to a seventh embodiment will be described. In this embodiment, the method of forming the protective film is different from that in the fifth embodiment. Thus, the method of forming the protective film according to the present embodiment will be described with reference to FIGS. 25 to 27.

Figure 25:
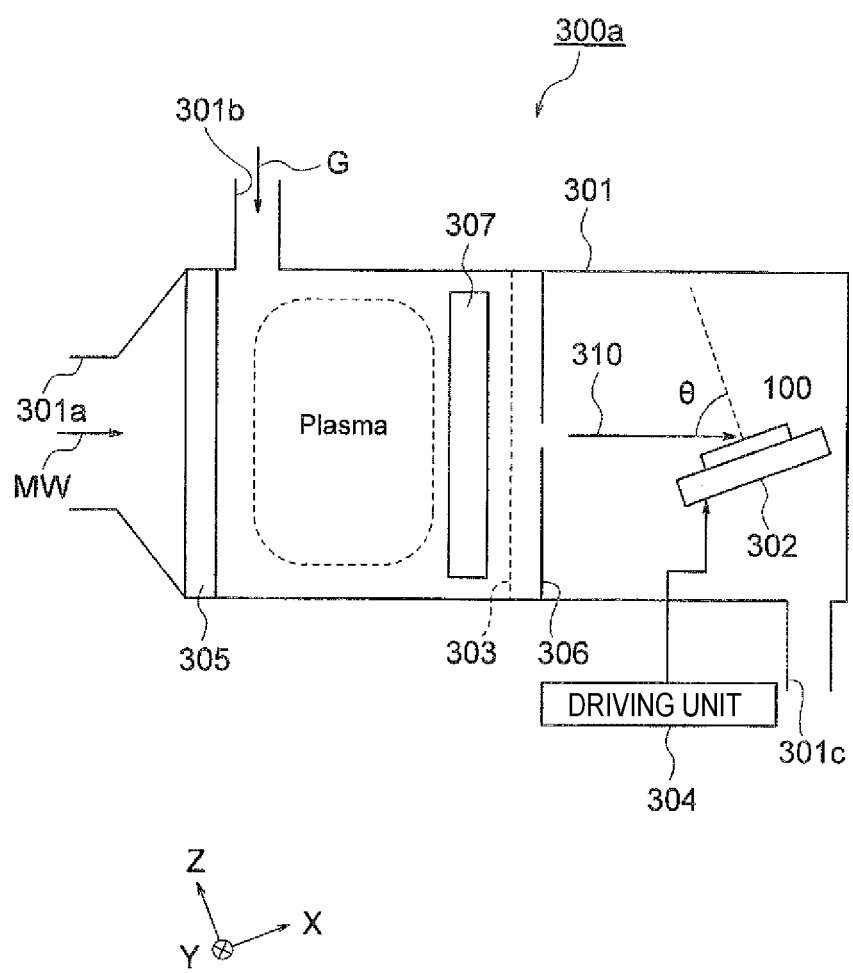
FIG. 25 is a schematic view of another ion beam irradiating apparatus.

FIG. 25 is a schematic view of an ion beam irradiating apparatus for forming the protective film according to the present embodiment. In FIG. 25, the same components as those of the ion beam irradiating apparatus 300 illustrated in FIG. 9 will be denoted by the same reference numerals, and detailed descriptions thereof will be omitted.

An ion beam irradiating apparatus 300a illustrated in FIG. 25 includes a deflector (mass selector) 307, in addition to the components of the ion beam irradiating apparatus 300 illustrated in FIG. 9. The deflector 307 separates ions by mass. For example, in the vacuum chamber 301, CF-based plasma containing a carbon element and a fluorine element or CHF-based plasma containing a carbon element, a hydrogen element, and a fluorine element is generated, and then, the deflector 307 may extract specific ion species. At this time, as the C/F ratio which is the ratio of the carbon ion to the fluorine ion is relatively high in the extracted ions, it is possible to form a protective film which prevents the expansion of the opening diameter of the recess 10b.

Figure 26:
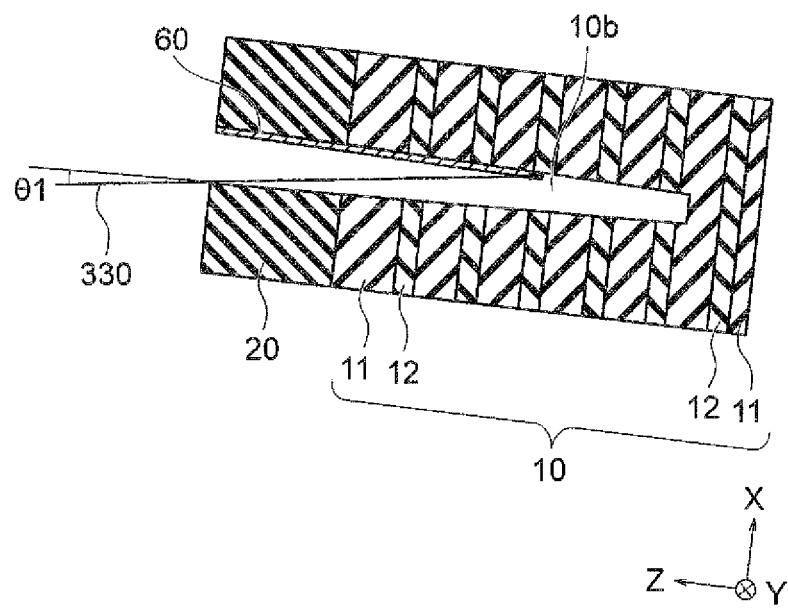
FIG. 26 is a cross-sectional view illustrating a process of forming a protective film by irradiating an ion beam at a first irradiation angle.

In the present embodiment, first, as illustrated in FIG. 26, the ion beam 330 is irradiated into the recess 10b at the first irradiation angle θ1 set to, for example, 3°. As a result, the protective film 60 is formed in the recess 10b. The ion species contained in the ion beam 330 is $CF^{3+}$.

Figure 27:
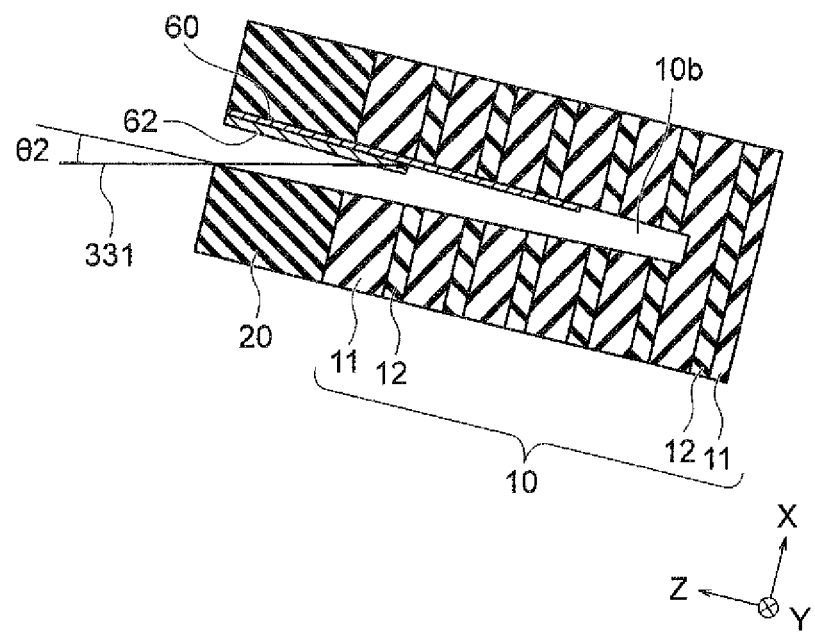
FIG. 27 is a cross-sectional view illustrating a process of forming a protective film by irradiating an ion beam having different ion species at a second irradiation angle.

Next, as illustrated in FIG. 27, the ion beam 331 is irradiated into the recess 10b at the second irradiation angle θ2 set to, for example, 5°. As a result, a protective film 62 is formed on the protective film 60. The ion species contained in the ion beam 331 is $CF^+$.

Since the second irradiation angle θ2 is larger than the first irradiation angle θ1, the deposition depth of the protective film 62 is shorter than the deposition depth of the protective film 60. Thus, as illustrated in FIG. 27, the protective film 62 is deposited on a portion of the protective film 60. The portion where the protective film 62 is deposited is a portion of the recess 10b where the opening diameter may be easily expanded. The protective film 62 is formed of the ion species which prevent the expansion of the recess 10b, as compared to the protective film 61. Thus, a relatively stronger protective film may be formed in the area where the recess 10b may be easily expanded.

Thus, according to the present embodiment, a relatively stronger protective film is deposited on the portion where the opening diameter may be easily expanded, so that it is possible to further reduce the occurrence of the processing defect.

Meanwhile, in the present embodiment, the number of times of changing the irradiation angle of the ion beam and the ion species is one. However, the number of changing times may be two or more. As the number of changing the irradiation angle and the ion species increases, the shape of the recess 10b can be finely controlled.

Further, the ion species are not limited to $CF^{3+}$ and $CF^+$. The ion species may include a hydrogen ion, and may be appropriately selected from a plurality of ionic species in which the ratios of a carbon ion, a fluorine ion, and a hydrogen ion are different.

Further, the protective film 60 or 62 is not limited to the carbon film described above, and may be a metal film containing, for example, a tungsten (W) element or an aluminum element (Al).

Further, in the fifth to seventh embodiments described above as well, when the second etching is performed by the irradiation with the ion beam 310, the ions contained in the ion beam 310 may be a cluster ion in which a plurality of atoms are combined with each other.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A film processing method comprising:
    forming a target film, the target film having a planar upper surface;
    forming a carbon film on the planar upper surface of the target film;
    performing a first etching to form at least a first recess and a second recess in the target film, with the carbon film serving as a mask; and
    performing a second etching, by directing an ion beam through only the second recess, to increase a depth of the second recess;
    wherein after the first etching, directing a first ion beam at an irradiation angle inclined with respect to the direction perpendicular to the upper surface to form a protective film on an upper portion of an inner surface of the second recess, and
    wherein in the second etching, directing a second ion beam toward the second recess at an angle perpendicular to the upper surface to further extend the second recess, wherein the second ion beam has an acceleration voltage higher than an acceleration voltage of the first ion beam.

2. The film processing method according to claim 1, further comprising irradiating the first ion beam while changing the irradiation angle.

3. The film processing method according to claim 2, further comprising changing ion species contained in the first ion beam, when changing the irradiation angle.

4. The film processing method according to claim 3, wherein the ion species are at least one of: (i) ions containing a carbon element; (ii) ions containing a carbon element and a hydrogen element; (iii) ions containing a carbon element and a fluorine element; or (iv) ions containing a carbon element, a hydrogen element, and a fluorine element.

5. The film processing method according to claim 1, wherein ions contained in the second ion beam are a cluster ion including a plurality of atoms combined with each other.

* * * * *